(12) United States Patent
Khalili et al.

(10) Patent No.: US 11,849,562 B2
(45) Date of Patent: Dec. 19, 2023

(54) HYBRID IN-DRAWER COMPUTER EQUIPMENT COOLING DEVICE

(71) Applicant: International Business Machines Corporation, Armonk, NY (US)

(72) Inventors: Sadegh Khalili, Poughkeepsie, NY (US); Yuanchen Hu, Wappingers Falls, NY (US); Milnes P. David, New Paltz, NY (US); Brian Werneke, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/652,343

(22) Filed: Feb. 24, 2022

(65) Prior Publication Data

US 2023/0269902 A1    Aug. 24, 2023

(51) Int. Cl.
*H05K 7/20*    (2006.01)
*F28F 1/32*    (2006.01)
*F28F 1/22*    (2006.01)

(52) U.S. Cl.
CPC ........... *H05K 7/20154* (2013.01); *F28F 1/22* (2013.01); *F28F 1/32* (2013.01)

(58) Field of Classification Search
CPC ... H01L 23/473; G06F 1/20; G06F 2200/201; H05K 7/20
See application file for complete search history.

(56) References Cited

U.S. PATENT DOCUMENTS

| | | | |
|---|---|---|---|
| 6,591,898 B1 | 7/2003 | Chu | |
| 7,405,936 B1 | 7/2008 | Campbell | |
| 7,637,312 B1 | 12/2009 | Heydari | |
| 7,724,524 B1 | 5/2010 | Campbell | |
| 7,864,527 B1 | 1/2011 | Whitted | |
| 7,963,119 B2 | 6/2011 | Campbell | |
| 9,295,181 B2 | 3/2016 | Campbell | |
| 9,504,186 B2 | 11/2016 | Dixler | |
| 9,588,554 B2 | 3/2017 | Hood, III | |
| 9,622,379 B1 | 4/2017 | Campbell | |
| 2005/0284166 A1* | 12/2005 | Mongia | F25B 49/02 62/259.2 |

(Continued)

FOREIGN PATENT DOCUMENTS

| | | |
|---|---|---|
| CN | 105097733 B | 11/2015 |
| CN | 205902307 U * | 1/2017 |

(Continued)

OTHER PUBLICATIONS

Notification of Transmittal of the International Search Report and the Written Opinion of the International Searching Authority, or the Declaration, Applicant's File Reference: IEE230017PCT, International Application No. PCT/CN2023/07475, dated May 10, 2023, International Filing Date: Feb. 8, 2023, Date of the actual completion of the international search: dated May 5, 2023, pp. 1-9.

*Primary Examiner* — Eric S Ruppert
(74) *Attorney, Agent, or Firm* — David B. Woycechowsky (57) ABSTRACT

A computer equipment cooling device comprising: a temperature dependent thermal conduction member that includes a first major surface and a second major surface; a set of fins connected in thermal communication with the first major surface; and a cold plate connected in thermal communication with the second major surface.

10 Claims, 9 Drawing Sheets

(56) References Cited

U.S. PATENT DOCUMENTS

| | | | |
|---|---|---|---|
| 2007/0121295 A1 | 5/2007 | Campbell | |
| 2010/0122802 A1* | 5/2010 | Yang | F28F 13/06 |
| | | | 165/104.31 |
| 2010/0175851 A1 | 7/2010 | Heydari | |
| 2013/0074520 A1 | 3/2013 | Wyatt | |
| 2019/0152286 A1* | 5/2019 | Lee | B60H 1/00278 |
| 2020/0341524 A1 | 10/2020 | Thakar | |

FOREIGN PATENT DOCUMENTS

| | | |
|---|---|---|
| CN | 207881324 U | 9/2018 |
| CN | 109668346 A | 12/2020 |
| CN | 112486285 A | 3/2021 |
| JP | 2007281215 A * | 10/2007 |
| WO | 2005053022 A1 | 6/2005 |
| WO | 2008146129 A2 | 12/2008 |

* cited by examiner

HYBRID IN-DRAWER COMPUTER EQUIPMENT COOLING DEVICE

BACKGROUND

The present invention relates generally to the field computer equipment cooling devices (sometimes here more simply referred to as "cooling devices") and more particularly to cooling devices that include both a radiator portion (for example, a set of fins) and a cold plate portion.

Some known cooling devices in a computing system perform both cooling of the liquid (radiator mode) and cooling of the air stream (intercooler mode). For example, US patent application publication number 2021/0378149 ("GAO") states as follows: "A cooling system for an electronic rack of a data center, such as an IT rack or PoD, is disclosed. The system includes a coolant distribution unit (CDU) coupled to a rack manifold of the electronic rack through a fluid cooling loop. The CDU supplies cooling fluid that is distributed to the IT rack or PoD, and receives returning warm/hot fluid from the IT rack or PoD. The system further includes an enhancing cooling unit to receive a first part of a first distributed portion of the cooling fluid and to further cool the first part of the first distributed portion of the cooling fluid to a lower temperature value than the one of the supplied cooling fluid through an enhancing cooling loop. The system further includes a first external cooling unit connected to the CDU through a cooling fluid loop to supply the cooling fluid to the CDU. The system further includes an air cooling unit to receive a second distributed portion of the cooling fluid and to use the second distributed portion of the cooling fluid to cool the airflow for IT rack or PoD. The system is arranged in five portions, and fluids and cooling units are shared among the portions within distributing loops."

SUMMARY

According to an aspect of the present invention, there is a method, computer program product and/or system that performs the following operations (not necessarily in the following order): A computer equipment cooling device comprising: (i) a cold plate member including a first major surface that is attachable to a surface of a computer component to be cooled, and a second major surface; (ii) an insulator member, made of thermally insulative material, having a first major surface that is mechanically connected to the second major surface of the cold plate member, and a second major surface; (iii) a heat dissipation member sized and shaped to communicate heat to its surrounding environment and to allow the passage of an air flow to be cooled, with the heat dissipation member being mechanically connected to the second major surface of the insulator member; and (iv) a conduit member that is connected to outlet of a cold plate or passes through the cold plate, and passes through the heat dissipation member, with the conduit member being sized and shaped to be suitable for carrying circulating cooling fluid, with the cooling fluid including at least one of the following components: a gaseous phase component and/or a liquid phase component.

According to an aspect of the present invention, there is a method, computer program product and/or system that performs the following operations (not necessarily in the following order): A computer equipment cooling device comprising: (i) a cold plate member including a first major surface that is attachable to a surface of a computer component to be cooled, and a second major surface; (ii) a temperature dependent thermal conductor (TDTC), structured to act as a thermal conductor when above a threshold temperature and as a thermal insulator when below the threshold temperature, the TDTC including a first major surface that is mechanically connected to the second major surface of the cold plate member, and a second major surface; (iii) a heat dissipation member sized and shaped to communicate heat to its surrounding environment and to allow the passage of an air flow to be cooled, with the heat dissipation member being mechanically connected to the second major surface of the TDTC; and (iv) a conduit member that passes through the cold plate and the heat dissipation member, with the conduit member being sized and shaped to be suitable for carrying circulating cooling fluid, with the cooling fluid including at least one of the following components: a gaseous phase component and/or a liquid phase component.

According to an aspect of the present invention, there is a method, computer program product and/or system that performs the following operations (not necessarily in the following order): A computer equipment cooling device comprising: (i) a cold plate member including a first major surface that is attachable to a surface of a computer component to be cooled, and a second major surface, (ii) a temperature dependent thermal conductor (TDTC), structured to act as a thermal conductor when above a threshold temperature and as a thermal insulator when below the threshold temperature, the TDTC including a first major surface that is mechanically connected to the second major surface of the cold plate member, and a second major surface, (iii) a heat dissipation member sized and shaped to communicate heat to its surrounding environment and to allow the passage of an air flow to be cooled, with the heat dissipation member being mechanically connected to the second major surface of the TDTC, (iv) a conduit member that passes through the cold plate and the heat dissipation member, with the conduit member being sized and shaped to be suitable for carrying circulating cooling fluid, and (v) a set of valve(s) installed in the conduit member, with the valves being switchable between a first position and a second position, with the first position allowing flow of circulating cooling fluid through a portion of the conduit member that passes through the heat dissipation member, and with the second position blocking flow of circulating cooling fluid through the portion of the conduit member that passes through the heat dissipation member, with the cooling fluid including at least one of the following components: (a) a gaseous phase component and/or a liquid phase component, (b) operating the computer cooling device with the set of valve(s) in the first position while the TDTC is below the threshold temperature to cool the circulating cooling fluid, and (c) operating the computer cooling device with the set of valve(s) in the second position while the TDTC is above the threshold temperature to cool the cold plate.

DETAILED DESCRIPTION

Some embodiments are directed to a hybrid liquid/air cooling device that increases a system's overall cooling capacity within an available space to improve the cooling performance. Some embodiments may include one, or more, of the following features, characteristics, advantages and/or operations: (i) improved cooling capacity due to limited heat exchange area in the RCU (radiator cooling unit which is the heat rejection subsystem of a computer system); (ii) reduced noise level via decreasing RCU's fans speed; (iii) improved cooling efficiency via cooler return air to data center room (in systems with WCU (water cooling unit which is a subsystem of a computer system); (iv) reducing the chance of throttling in hot environments under extreme IT (information technology computing) loads; and/or (iv) reduced preheat to the downstream components such as optics and data storage subsystems.

Some embodiments may include one, or more, of the following features, characteristics, advantages and/or operations: (i) a design that utilizes available airflow and space inside a drawer to increase the heat dissipation capacity of a liquid cooling system; (ii) redundant air cooling for a liquid-cooled system; (iii) acts as an intercooler to reduce thermal shadowing where chilled water is available (systems with a WCU) or when processor load is not significant; (iv) takes the fluid at the outlet of a cold plate to a radiator that is integrated with the cold plate; (v) the module can serve different goals based on the thermal conditions of the cooling system; (vi) transfers a portion of heat absorbed in the cold plate to airflow in the server in one of the flow routing condition; (vii) pre-cools the fluid before sending it back to the main cooling unit and adds capacity to the total system cooling capacity; (viii) the flow routing mechanism allows reversing the flow direction to reduce preheat and provide air-cooling to downstream components via sending the cool fluid to the radiator first; (ix) a smart routing feature allows bypassing the radiator when external cooling capacity is enough for handling the thermal load of the drawer; (x) bypassing the radiator reduces the pressure drop in the liquid loop and lowers the workload on pumps; (xi) can be used in a two phase fluid cooling subsystem, with liquid and vapor phases present in the cooling fluid; and/or (xii) the refrigerant can be mixed gas and liquid.

An embodiment of a hybrid in-drawer cold plate-radiator according to the present invention includes: (i) a radiator structure disposed on an insulator, the insulator disposed on a cold plate, the cold plate disposed on a package lid, and the package lid disposed on a printed circuit board; (ii) the radiator includes a plurality of vertical fins with a first conduit section of a fluid conduit subsystem passing through the plurality of fins and a second conduit section disposed inside the cold plate, where each pipe of the plurality of pipes is a conduit for a liquid; and (iii) a bypass valve configured to direct liquid towards the first pipe disposed inside the cold plate and away from a remaining amount of the plurality of pipes. With respect to the conduit subsystem of item (ii), it is noted that the second conduit section may be in the form of an interior cavity defined within the body of the cold plate itself.

Some embodiments may include one, or more, of the following features, characteristics, advantages and/or operations: (i) provides simultaneous cooling of air and direct cooling of heat generating components; (ii) increases overall water-to-air heat exchange capacity in the same given system volume when needed; (iii) reduces thermal shadowing on downstream components by absorbing heat from air; (iv) increases reliability by offering redundant cooling structure; (v) a specially designed structure with both cold plate liquid cooling and heatsink air-cooling for the same heat generation component; (vi) reduces thermal shadowing within a server based on the working conditions and desired function enabled by the specially designed valve and control mechanism; (vii) dissipates at least a portion of absorbed heat by the liquid in the cold plate to air directly in the server when operating in the radiator mode; (viii) automatically regulates heat transfer from cold plate to heat sink based on intrinsic conditions; (ix) offers versatility of functioning as both radiator and air cooler via incorporating smart valving to reverse flow direction; (x) has higher cooling performance and efficiency as cold plates are used versus air-cooling only; (xi) reduces thermal shadowing on downstream server components by absorbing heat from air within a server; (xii) doesn't require a sealed enclosure which translates to simpler physical structure and facilitates maintenance of equipment; (xiii) the ability to use air from room increases ride-through time in liquid cooling failures; and/or (xiv) increases overall water-to-air heat exchange capacity in the same given system volume when needed.

Some embodiments may include one, or more, of the following features, characteristics, advantages and/or operations: (i) uses the available space above cold plates and doesn't require extra overhead space; (ii) optimized arrangement for heat exchanger tubes within the air-cooling fin stack to maximize heat transfer in the intercooler and radiator modes; (iii) optimized fin stack to achieve a desirable balance between added capacity to the RCU and thermal shadowing on the downstream components; (iv) increases reliability by offering redundant cooling structure and method; (v) allows increasing overall radiative heat removal capacity in the same given system volume when needed via operating in the radiator mode by reversing flow direction; (vi) the radiator function offers extra cooling capacity for the system radiator and facilitates heat transfer to environment; (vii) offers versatility of functioning as both radiator and air cooler via incorporating smart valving to reverse flow direction; (viii) discloses a smart valving feature to allow for reverse flow and switching between intercooler and radiator modes based on system conditions; (ix) includes a structure integrated with the cold plate assembly (insulator layer described below) to allow for automatic regulation of heat transfer based on the intrinsic conditions; and/or (x) optimization of the heat exchanger tubes within the air-cooling fin stack.

Figure 1:
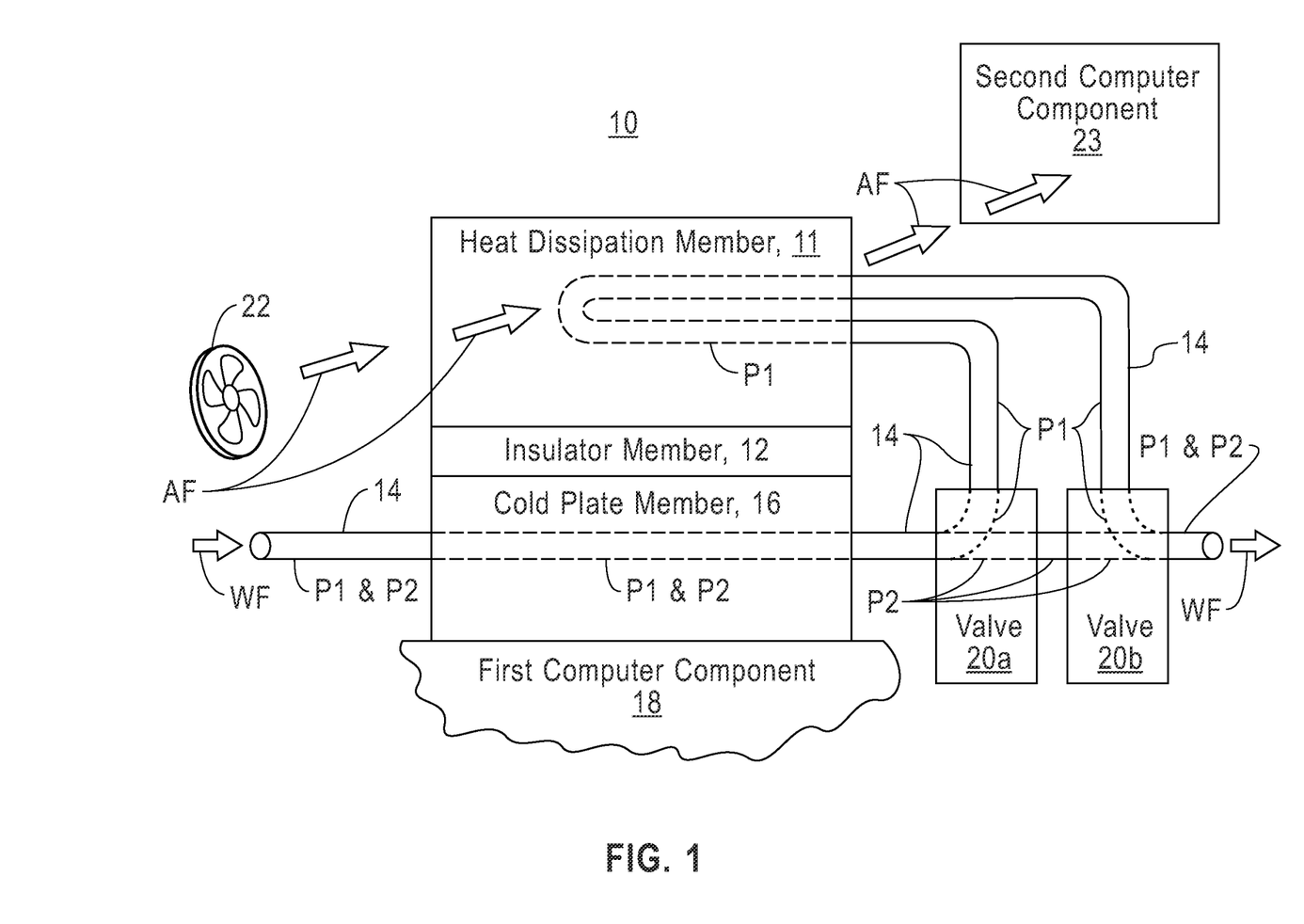
FIG. 1 is a schematic front view of a first embodiment of a cooling device according to the present invention.

As shown in FIG. 1, computer component cooling device 10, according to an embodiment of the present invention, includes: heat dissipation member 11; insulator member 12; fluid conduits 14; cold plate member 16; first computer component 18; valves 20a and 20b; fan 22; and second computer component 23. In this embodiment, only second computer component 23 is cooled by airflow AF. Alternatively, additional components could be cooled by airflow AF, such as an additional component located along the airflow between fan 22 and heat dissipation member 11. In this embodiment, the air of airflow AF is not re-circulated, but it may be re-circulated in some embodiments.

Device 10: (i) cools the first computer component by fluid (in this example, water) circulation; and (ii) cools the second computer component by air cooling. The direction of cooling fluid into and out of device 10 is shown by the arrows labelled WF. In this example, the fluid circulation, into and out of device 10, is unidirectional, but, as discussed elsewhere herein, some embodiments can reverse the flow direction. The direction of the airflow is shown by the arrows labelled AF. The valves work in a coordinated manner and can be switched between: (i) a first position (also called a dual cooling action position) P1; exclusive or (ii) a second position (also called a bypass position) P2. The P1 and P2 labels show where the fluid flows, depending upon whether the valves are in the first position or the second position.

In this embodiment, the heat dissipation member is shaped as a set of fins. Alternatively, other geometries, known or to be developed in the future (for example, posts or hairs), may be used in the heat dissipation member. The heat dissipation member: (i) removes heat from the cooling fluid when the valves are in first position P1 so that cooling fluid flows through the portion of conduits 14 that pass through the heat dissipation member; and (ii) removes heat from cold plate member 16 regardless of valve position.

In operation, heat is removed from first computer component 18, regardless of valve position, by the following thermal path: (i) heat flows from component 18 into the body of cold plate member 16; (ii) heat flows into the cooling fluid as it passes through the cold plate member; and (iii) the cooling fluid carries heat away from the cold plate member as the cooling fluid flows out of the cold plate member. In some embodiments, and as discussed in connections with FIGS. 2A, 2B, 3A and 3B, insulator member 12 may be replaced with a temperature dependent thermal conductor member (TDTC) that can selectively carry heat away, depending on temperature, from the cold plate member and into the heat dissipation member.

In the intercooler operation, heat is removed from second computer component 23 by the following thermal path: (i) fan 22 generates air flow AF; (ii) air flow AF cools as it flows through heat dissipation member 11; and (iii) the cooled air of air flow AF flows past second computer component 23 to cool it.

Some embodiments computer cooling systems according to the present invention include a control subsystem, a fluid cooling subsystem and an air cooling subsystem. The air and fluid cooling subsystems physically interact in a heat dissipation member (for example, a radiator including a set of fins. Some embodiments utilize the available airflow and space inside a drawer to reduce impact of thermal shadowing (intercooler mode) and to increase heat dissipation capacity of the liquid cooling system (radiator mode). In some embodiments, the control subsystem instructs switching between intercooler and radiator modes. In some embodiments, a temperature dependent thermal conductor (TDTC) is physically interposed between a cold plate and a set of fins.

Some embodiments of integrated radiator-cold plates according to the present invention: (i) have versatile design can dynamically be used as an intercooler or as a radiator based on system needs; (ii) include smart valving and fluid driving component(s) to reverse the flow and switch between the intercooler and radiator modes based on system operating conditions; (iii) direct the circulating cooling fluid to bypass the intercooler/radiator to reduce the pressure drop (caused by driving the cooling fluid through conduits) when these functions are not needed; (iv) include a TDTC to selectively allow more heat transfer when operating in radiator mode, while insulating in intercooler mode; and/or (v) heat exchanger coil spacing and positioning can be designed to maximize heat transfer potentials (that is, temperature differences between adjacent things).

Figure 2A:
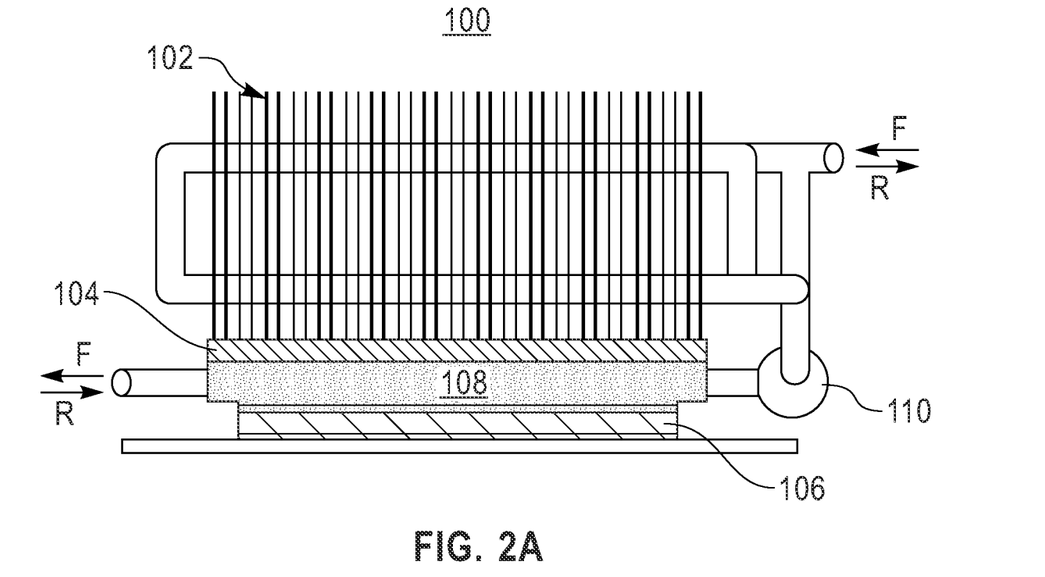
FIG. 2A is an orthographic front view of a second embodiment of a cooling device according to the present invention.
Figure 2B:
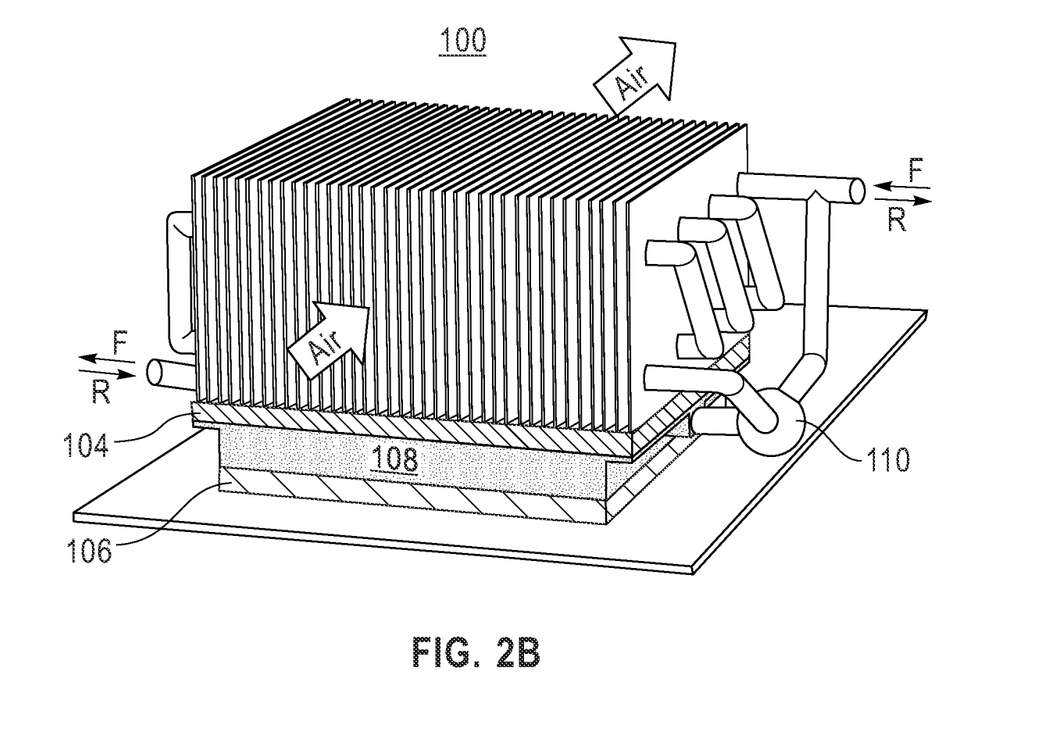
FIG. 2B is a perspective view of the second embodiment cooling device.

As shown in FIGS. 2A and 2B, computer cooling system 100 includes: fins 102; insulator 104; cooled computer component 106; cold plate 108; and bypass valve 110. In this embodiment, the fluid driving component(s) (not shown in the Figures) can drive fluid in the direction of the arrow labelled F and also in the direction of the arrow labelled R.

Figure 5A:
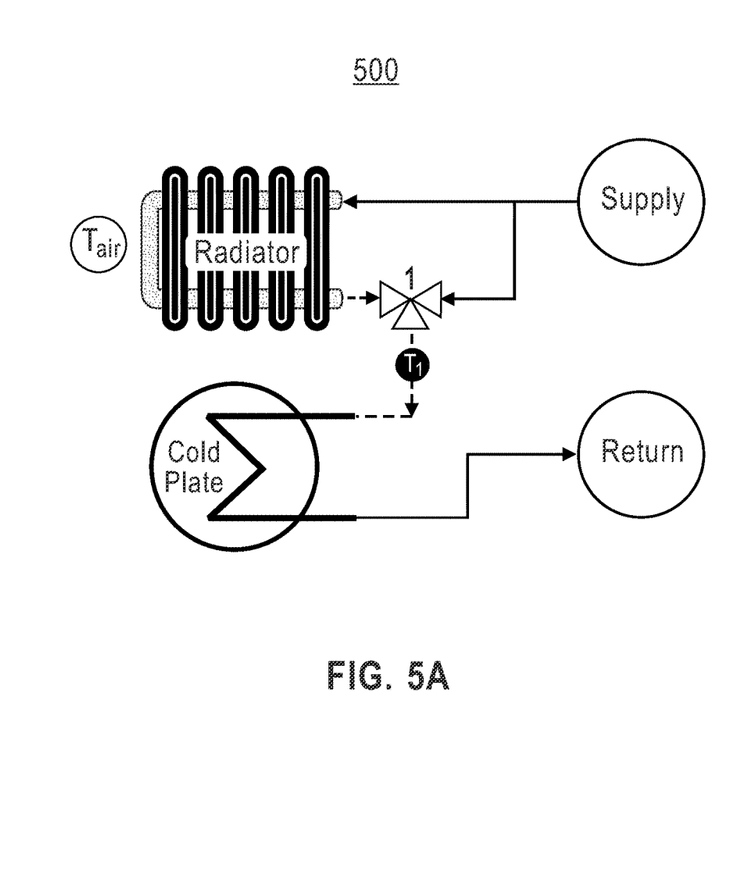
FIG. 5A is a schematic view of a fifth embodiment of a cooling device according to the present invention.
Figure 5B:
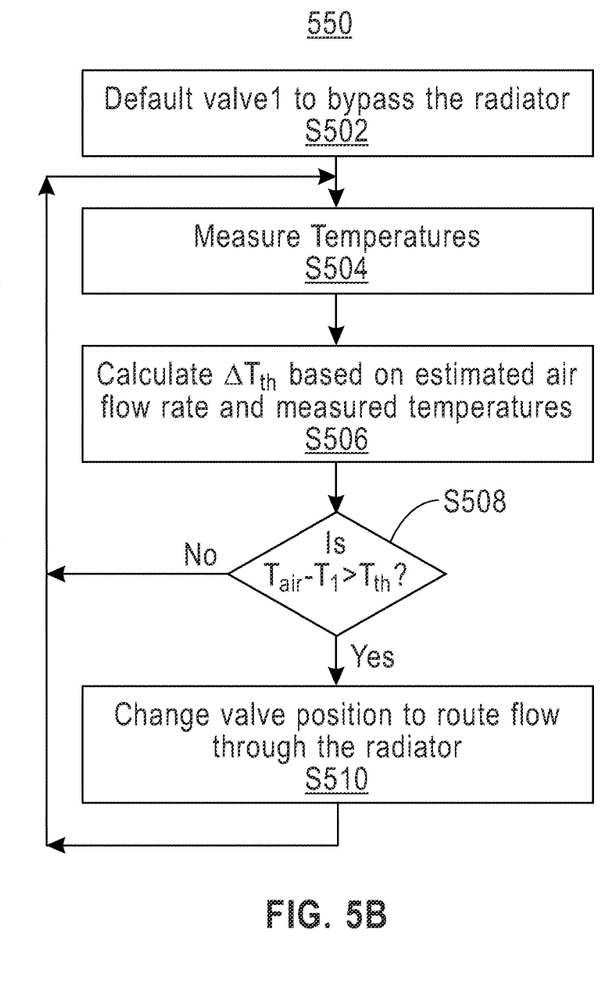
FIG. 5B is a flowchart showing a method performed by the fifth embodiment cooling device.
Figure 6A:
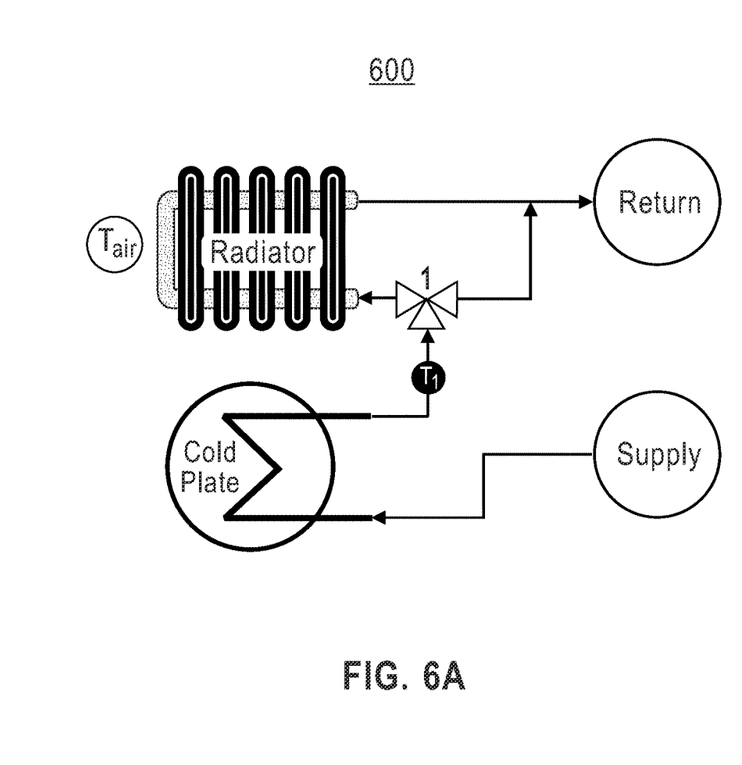
FIG. 6A is a schematic view of a sixth embodiment of a cooling device according to the present invention.
Figure 6B:
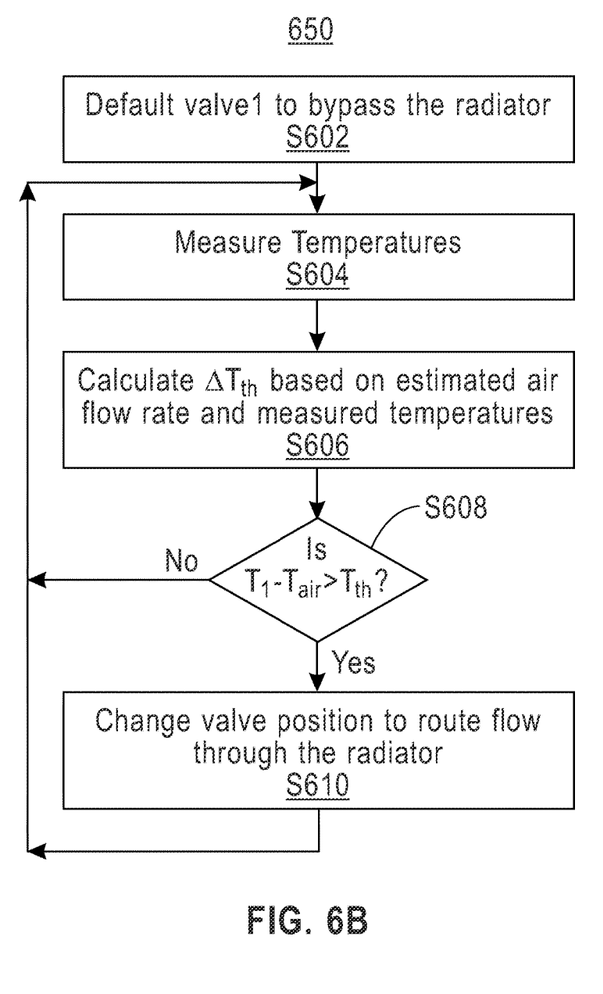
FIG. 6B is a flowchart showing a method performed by the sixth embodiment cooling device.

When flow passes through the conduits, the system can be in either of intercooler or radiator modes. Also, in the bypass mode the goal is to reduce pressure drop and load on the pumps while the goal of radiator mode is to cool water before sending it to RCU. The control system determines mode of operation depending on the operational conditions of the system as shown in FIGS. 5 and 6.

Figure 3A:
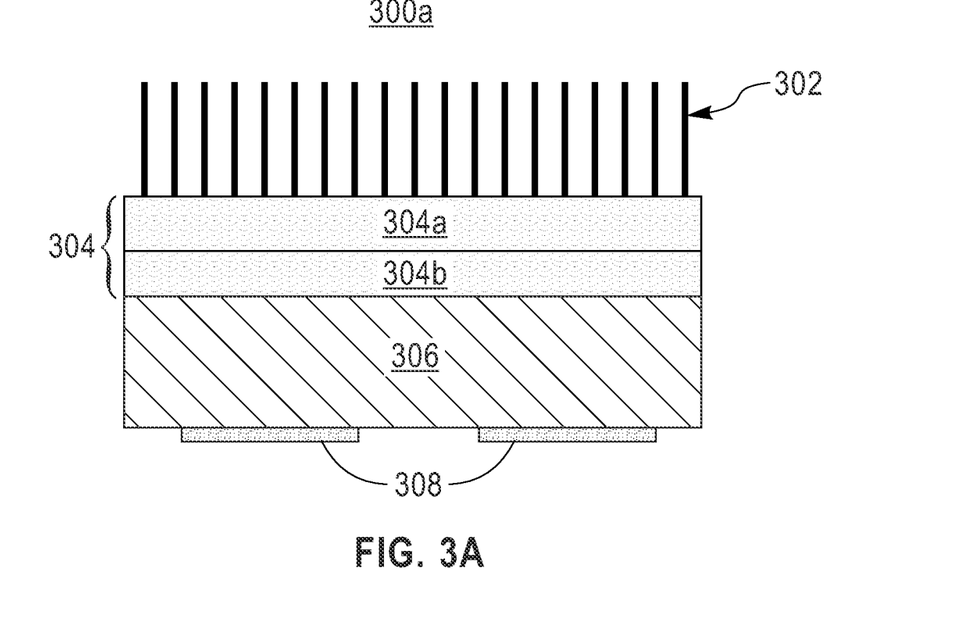
FIG. 3A is a cross-sectional view of a third embodiment of a cooling device according to the present invention in a first state.
Figure 3B:
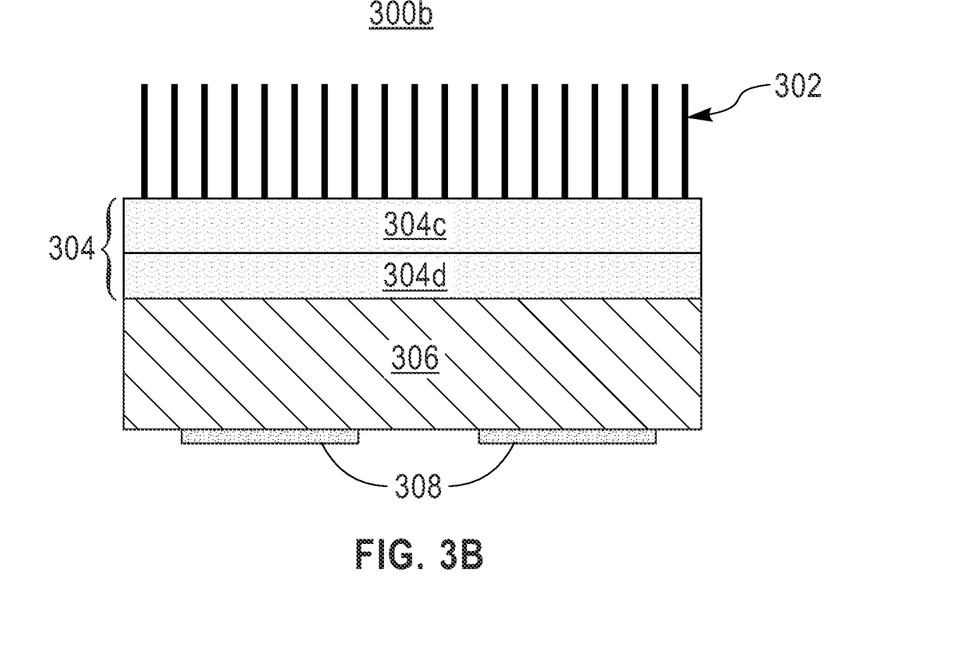
FIG. 3B is a cross-sectional view of the third embodiment cooling device in a second state.

As shown in FIGS. 3A and 3B, computer cooling system 300 (at various times, in insulator configuration 300a and conductive configuration 300b) includes: fins 302; TDTC 304; cold plate 306; and cooled computer component 308. In FIG. 3A, the computer cooling system is in insulator configuration and the TDTC includes vapor layer 304a and liquid layer 304b. In FIG. 3B, the computer cooling system is in conductive configuration and the TDTC includes steam layer 304c and boiling fluid layer 304d. In embodiments that use TDTCs, TDTC of any design (for example, solid state TDTCs), now known or developed in the future may be used. TDTC 304 insulates the fins from the cold plate to allow maximum cooling in the intercooler mode. When the cold plate 306 temperature exceeds a threshold, then TDTC 304 becomes thermally conductive to effect additional/redundant cooling of component 308 through fins 302. TDTC 304 can be a partially filled chamber that contains a liquid with a boiling point near the temperature threshold. When the cold plate temperature is below the threshold, it acts as an insulator. At higher temperature, boiling boosts the conductivity through the chamber and allow high heat transfer rate between the cold plate and fins. TDTC 304: (i) insulates the fins from the base in the intercooler mode to prevent heat transfer to air; and (ii) in the bypass mode, conducts heat from the base to the fins to improve overall heat transfer performance.

Figure 4:
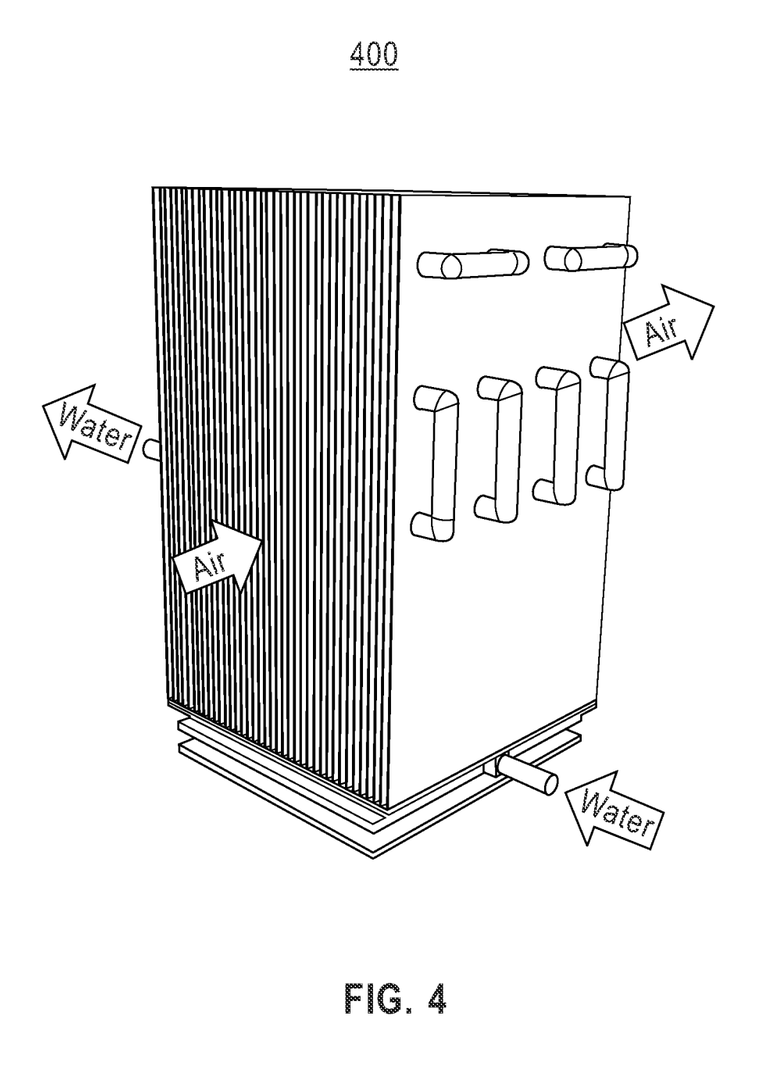
FIG. 4 is a perspective view of a fourth embodiment of a cooling device according to the present invention.

As shown by computer cooling system 400 of FIG. 4, fins' height can be optimized to achieve a desirable balance between added capacity to the RCU and thermal shadowing on the downstream components. The structure can be installed in the space that heat pipe heat sinks were installed.

Figure 7:
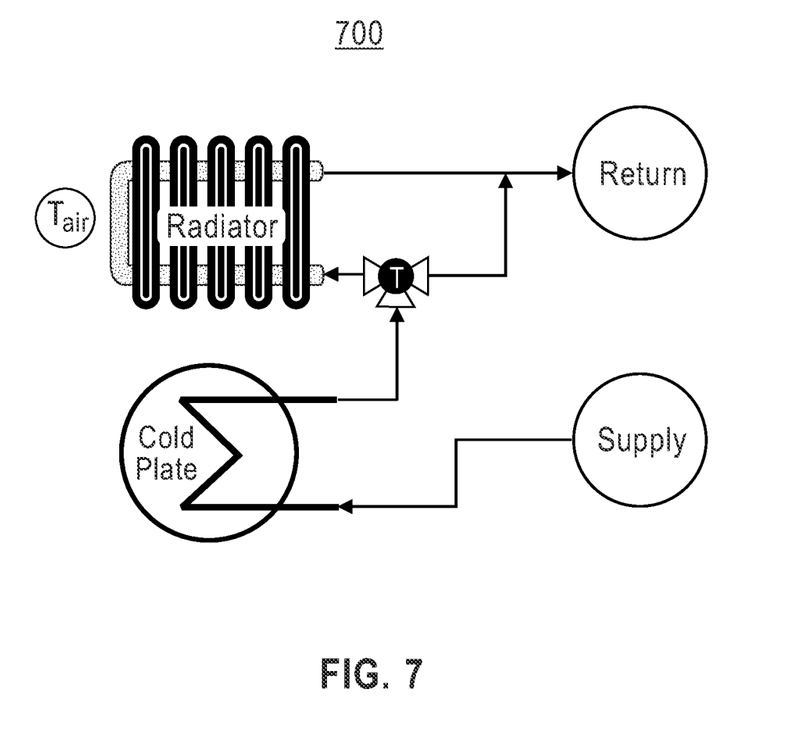
FIG. 7 is a schematic view of a seventh embodiment of a cooling device according to the present invention.

Smart flow routing and operation of the bypass valve will now be discussed. As shown by diagram 500 of FIG. 5A and flowchart 550 of FIG. 5B, in the intercooler mode an electronic valve operating based on air and water temperatures to bypass the radiator when heat absorption potential from air is negligible or not possible. Process flow of FIG. 5B includes the following operations: S502; S504; S506; S508 and S510. As shown by diagram 600 of FIG. 6A and flowchart 650 of FIG. 6B, in the radiator mode, an electronic valve operating based on air and water temperatures to bypass the radiator when heat dissipation potential to air is negligible or not possible (bypass mode). Process flow of FIG. 6B includes the following operations: S602; S604; S606; S608 and S610. As shown by diagram 700 of FIG. 7, a thermostatic valve determines whether to utilize the in-drawer radiator or not based on the utilized capacity of the main radiator in the RCU. If the RCU is able to supply coolant at a desired temperature, a thermostatic valve bypasses the in-drawer radiator to reduce pumps' workload. If the RCU is not able to supply coolant at a desired temperature, a thermostatic valve directs the coolant to the in-drawer radiator.

As shown in FIGS. 5A and 5B, valves are defaulted to bypass the radiator (bypass mode). The control system measures $T_1$ and $T_{air}$. The temperature difference threshold $\Delta T_{th}$ is calculated based on the airflow rate in the system, measured temperatures. $\Delta T_{th}$ is a measure of the heat transfer potential between air and the fins, and is used to evaluate the benefit of operating in the intercooler mode versus operating in the bypass mode. If the heat transfer potential is large enough, the control system adjusts the valves to route the flow through the heat exchanger tubes (intercooler mode).

As shown in FIGS. 6A and 6B, valves are defaulted to bypass the radiator (bypass mode). The control system measures $T_1$ and $T_{air}$. The temperature difference threshold $\Delta T_{th}$ is calculated based on the airflow rate in the system, measured temperatures. $\Delta T_{th}$ is a measure of the heat transfer potential between the radiator and air and is used to evaluate the benefit of operating in the radiator mode versus operating in the bypass mode. If the heat transfer potential is large enough, the control system adjusts the valves to route the flow through the radiator (radiator mode).

Smart flow routing and flow reversing will now be discussed. As shown by diagram 800 of FIG. 8A and flowchart 850 of FIG. 8B, using electronic valves for reversing the flow direction to provide cooling to downstream components when possible and desired. Process flow of FIG. 8B includes the following operations: S802; S804; S806; and S808. As shown by diagram 900 of FIG. 9A and flowchart 950 of FIG. 9B, using a redundant reversed pump for reversing the flow direction to provide cooling to downstream components when possible and desired. Process flow of FIG. 9B includes the following operations: S902; S904; S906; and S908.

Figure 8A:
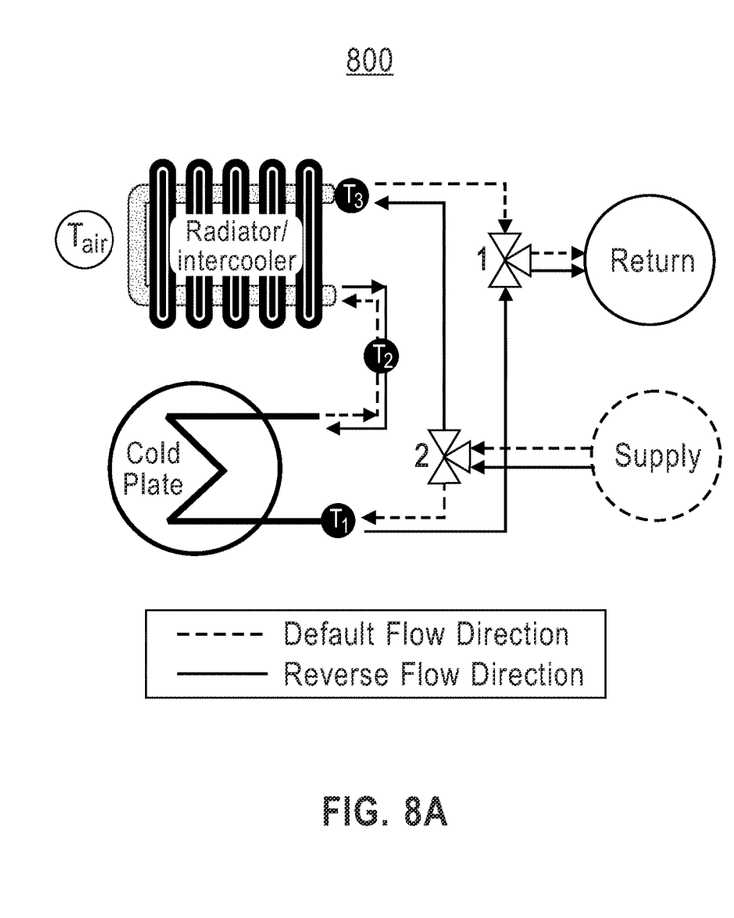
FIG. 8A is a schematic view of an eighth embodiment of a cooling device according to the present invention.
Figure 8B:
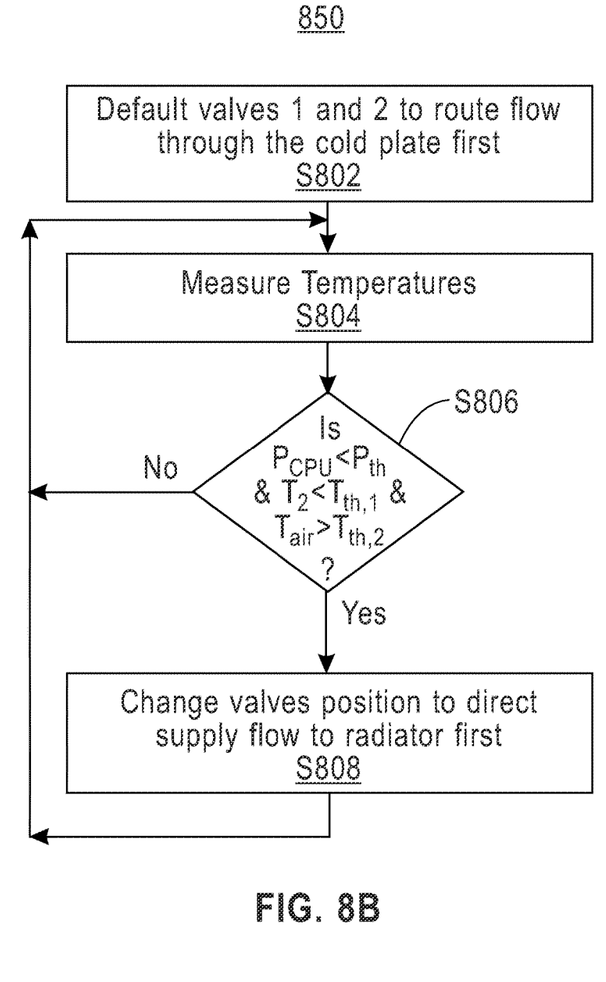
FIG. 8B is a flowchart showing a method performed by the eighth embodiment cooling device.

As shown in FIGS. 8A and 8B, valves are in the default position to send the fluid to the cold plate first (default flow direction). Control system measures the temperatures and heat dissipation (power) of the computer component $P_{CPU}$. If $P_{CPU}$ is less than a predefined threshold $P_{th}$, meaning the heat dissipation is relatively small, and fluid temperature $T_2$ is cooler than the first temperature threshold $T_{th,1}$ and air temperature approaching the radiator Tan is larger than a second temperature threshold $T_{th,2}$, it means that there is potential for cooling air via operating in the intercooler mode by sending the fluid to the intercooler first (operation in the reverse flow direction). So, control system switches to the flow direction to reverse.

Figure 9A:
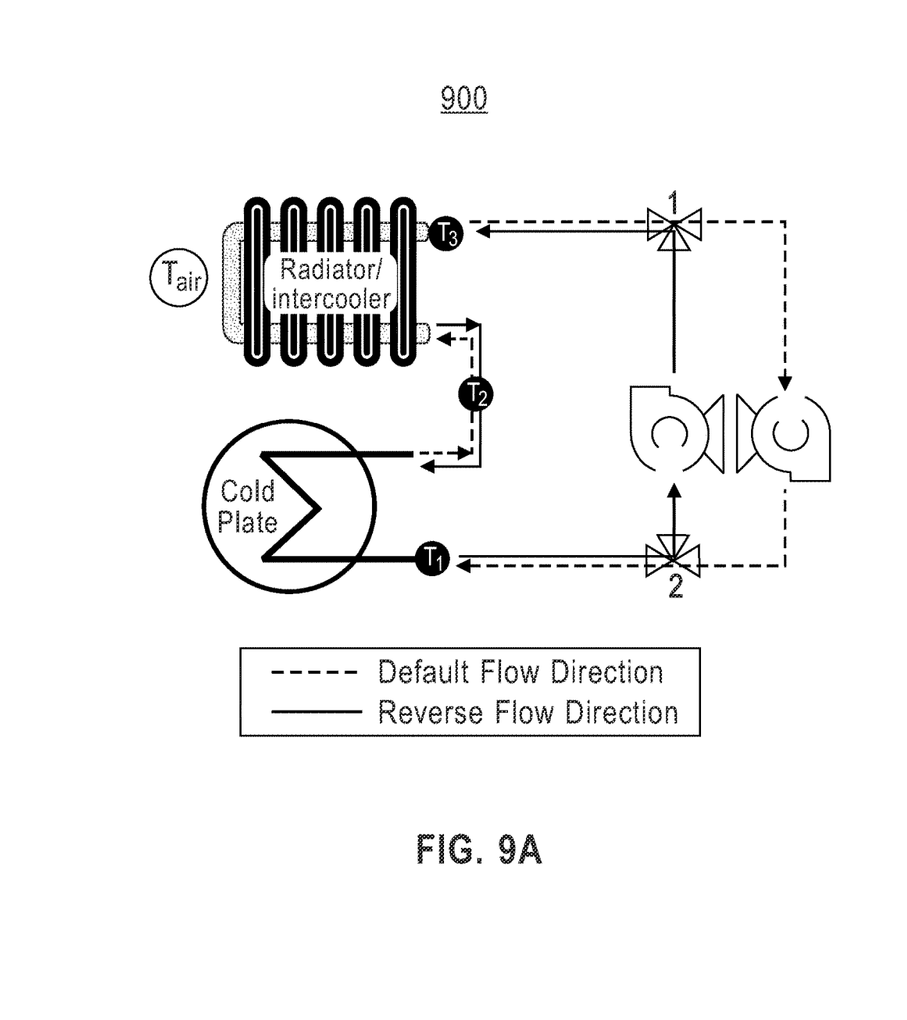
FIG. 9A is a schematic view of a ninth embodiment of a cooling device according to the present invention.
Figure 9B:
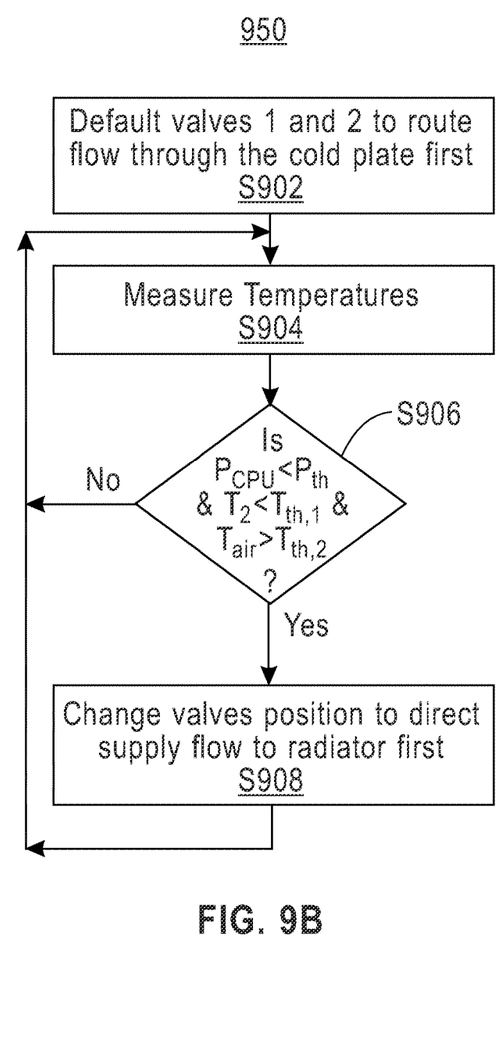
FIG. 9B is a flowchart showing a method performed by the ninth embodiment cooling device.

As shown in FIGS. 9A and 9B, operations are similar to description for of FIGS. 8A and 8B in the previous paragraph, except the flow reversal mechanism is via the redundant reverse pump.

Integrated radiator-cold plate: (i) versatile design that can dynamically be used as an intercooler or as a radiator based on system needs; (ii) smart valving to reverse the flow and switch between the intercooler and radiator modes based on system operating conditions; (iii) bypass the intercooler/radiator to reduce the pressure drop when these functions are not needed; (iv) TDTC to enables heat transfer only in radiator mode while insulating in intercooler mode; and (iv) with respect to heat exchanger coil spacing and positioning, coils should be positioned with a specific distance from the base to avoid a negative impact on the heat exchange with air.

Some definitions will be set forth in the following paragraphs.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

And/or: inclusive or; for example, A, B "and/or" C means that at least one of A or B or C is true and applicable.

Including/include/includes: unless otherwise explicitly noted, means "including but not necessarily limited to."

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

Set of thing(s): does not include the null set; "set of thing(s)" means that there exist at least one of the thing, and possibly more; for example, a set of computer(s) means at least one computer and possibly more.

Virtualized computing environments (VCEs): VCEs can be stored as "images." A new active instance of the VCE can be instantiated from the image. Two types of VCEs are virtual machines and containers. A container is a VCE that uses operating-system-level virtualization. This refers to an operating system feature in which the kernel allows the existence of multiple isolated user-space instances, called containers. This isolated user-space instances may look like real computers from the point of view of programs running in them. A computer program running on an ordinary operating system can see all resources (connected devices, files and folders, network shares, CPU power, quantifiable hardware capabilities) of that computer. However, programs running inside a container can only see the container's contents and devices assigned to the container.

Cloud computing system: a computer system that is distributed over the geographical range of a communication network(s), where the computing work and/or computing resources on the server side are primarily (or entirely) implemented by VCEs (see definition of VCEs in previous paragraph). Cloud computing systems typically include a cloud orchestration module, layer and/or program that manages and controls the VCEs on the server side with respect to instantiations, configurations, movements between physical host devices, terminations of previously active VCEs and the like.

What is claimed is:

1. A computer system including an equipment cooling device, the computer system including a computer component, a fan a liquid cooling unit and an, information technology (IT) rack, the computer system comprising:
    a cold plate member including a first major surface that is attached to the computer component to be cooled, and a second major surface;
    an insulator member, made of thermally insulative material, having a first major surface that is mechanically connected to the second major surface of the cold plate member, and a second major surface;
    a radiator sized and shaped to communicate heat to its surrounding environment, with the radiator being located and oriented so that an airflow generated by the fan blows through the radiator and onto the IT rack; and
    a conduit member that passes through the cold plate member, and passes through the heat dissipation member, with the conduit member being sized and shaped to be suitable for carrying circulating cooling liquid along a continuous path that passes: (i) first through a portion of the conduit that passes through the cold plate member, and (ii) then through the radiator and (iv) then through the liquid cooling unit to form a cooling liquid cycle;
    wherein the computer system is configured so that a portion of the conduit member that passes through the radiator chills the airflow before the airflow reached the IT rack.

2. The device computer system of claim 1 further including:
    a set of valve(s) installed in the conduit member, with the valves being switchable between a first position and a second position, with the first position causing the conduit member to communicate the circulating cooling liquid first through the cold plate member and then through the heat dissipation member, and with the second position causing the conduit member to communicate cooling liquid through the cold plate member but not through the radiator.

3. The device computer system of claim 1 wherein the radiator includes a set of fins.

4. The computer system of claim 1 further comprising a fluid driving device that can be controlled to drive fluid in either direction through the conduit member.

5. The computer system of claim 1 wherein, during operation, the circulating cooling liquid is water.

6. A computer system comprising:
    a computer component;
    a fan;
    a liquid cooling unit;
    an information technology (IT) rack;
    a cold plate member including a first major surface that is attached to the computer component to be cooled, and a second major surface;
    an insulator member, made of thermally insulative material, having a first major surface that is mechanically connected to the second major surface of the cold plate member, and a second major surface;
    a radiator sized and shaped to communicate heat to its surrounding environment, with the radiator being located and oriented so that an airflow generated by the fan blows through the radiator and onto the IT rack; and
    a conduit member that passes through the cold plate member, and passes through the heat dissipation member, with the conduit member being sized and shaped to be suitable for carrying circulating cooling liquid along a continuous path that passes: (i) first through a portion of the conduit that passes through the cold plate member, and (ii) then through the radiator and (iv) then through the liquid cooling unit to form a cooling liquid cycle;
    wherein the computer system is configured so that a portion of the conduit member that passes through the radiator chills the airflow before the airflow reached the IT rack.

7. The computer system of claim 6 further including:
    a set of valve(s) installed in the conduit member, with the valves being switchable between a first position and a second position, with the first position causing the conduit member to communicate the circulating cooling liquid first through the cold plate member and then through the heat dissipation member, and with the second position causing the conduit member to communicate cooling liquid through the cold plate member but not through the radiator.

8. The computer system of claim 6 wherein the radiator includes a set of fins.

9. The computer system of claim 6 further comprising a fluid driving device that can be controlled to drive fluid in either direction through the conduit member.

10. The computer system of claim 6 wherein, during operation, the circulating cooling liquid is water.

* * * * *